(12) United States Patent
Weigert et al.

(10) Patent No.: US 6,581,669 B2
(45) Date of Patent: Jun. 24, 2003

(54) SPUTTERING TARGET FOR DEPOSITING SILICON LAYERS IN THEIR NITRIDE OR OXIDE FORM AND A PROCESS FOR ITS PREPARATION

(75) Inventors: Martin Weigert, Hanau (DE); Uwe Konietzka, Geiselbach (DE)

(73) Assignee: W.C. Heraeus GmbH & Co., KG, Hanau (DE)

(*) Notice: Subject to any disclaimer, the term of this patent is extended or adjusted under 35 U.S.C. 154(b) by 0 days.

(21) Appl. No.: 09/829,434

(22) Filed: Apr. 10, 2001

(65) Prior Publication Data

US 2002/0008021 A1 Jan. 24, 2002

Related U.S. Application Data

(63) Continuation-in-part of application No. 09/261,211, filed on Mar. 3, 1999, now abandoned.

(30) Foreign Application Priority Data

Mar. 10, 1998 (DE) .......................... 198 10 246

(51) Int. Cl.$^7$ .............................. B22D 27/15
(52) U.S. Cl. ..................................... 164/61
(58) Field of Search ............................. 164/61

(56) References Cited

U.S. PATENT DOCUMENTS 4,769,291 A * 9/1988 Belkind et al. ........ 204/192.26
5,094,288 A * 3/1992 Williams ..................... 164/80
5,328,585 A * 7/1994 Stevenson et al. ....... 204/298.2
5,853,816 A  12/1998 Vanderstraeten ............ 427/452
6,045,634 A * 4/2000 Annavarapu ................ 148/671

FOREIGN PATENT DOCUMENTS

| DE | 4242079 A1 | 6/1994 |
|---|---|---|
| DE | 19527476 | 1/1997 |
| EP | 0165413 | 12/1985 |
| JP | 52 144 313 A | * 12/1977 |
| JP | 04 184 732 A | * 7/1992 |
| JP | 08 193 236 A | * 7/1996 |

* cited by examiner

Primary Examiner—Patrick Ryan
Assistant Examiner—Gregg Cantelmo
(74) Attorney, Agent, or Firm—Smith, Gambrell & Russell, LLP

(57) ABSTRACT

The target material for a sputtering target for depositing silicon layers in their nitride or oxide form by means of reactive cathode atomization, such as e.g. $Si_3N_4$ or $SiO_2$ in the form of optical functional layers or in the form of thermal protective layers on glass substrates, is a cast silicon element, that has been solidified from the melt condition and which forms a parallelepiped, with a dopant, that has been mixed in with the melt, whereby the dopant is 1 wt % to 15 wt % aluminum, and whereby the casting mold preferably has a cavity which forms a parallelepiped.

5 Claims, 1 Drawing Sheet

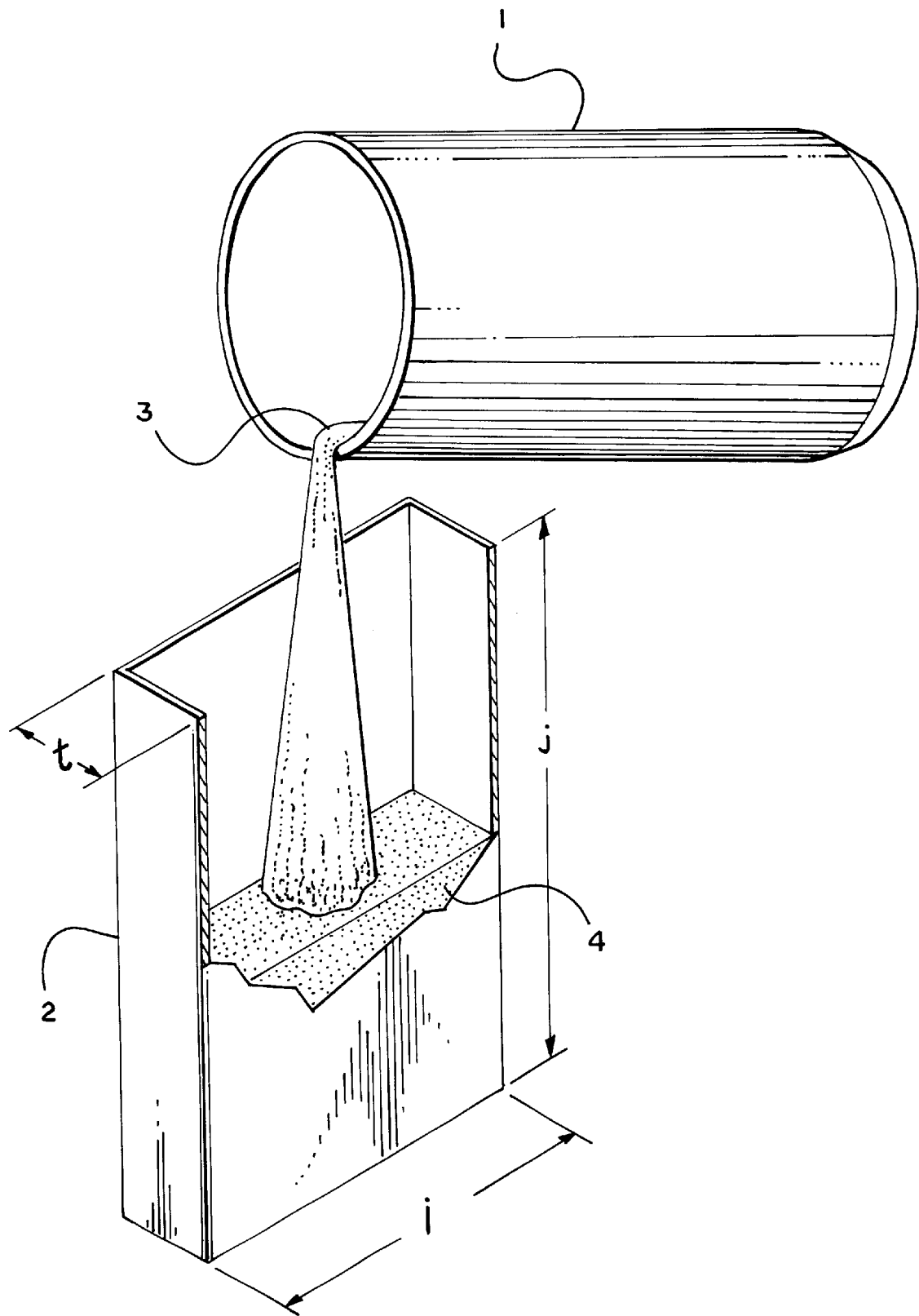

1

SPUTTERING TARGET FOR DEPOSITING SILICON LAYERS IN THEIR NITRIDE OR OXIDE FORM AND A PROCESS FOR ITS PREPARATION

REFERENCE TO A RELATED APPLICATION

This is a continuation-in-part of our copending application Ser. No. 09/261,211 filed Mar. 3, 1999 now abandoned which is relied on and incorporated herein by reference.

INTRODUCTION AND BACKGROUND

The present invention relates to a sputtering target for depositing silicon layers in their nitride or oxide form by means of reactive cathode atomization, such as e.g. $Si_3N_4$ or $SiO_2$ in the form of optical functional layers on glass substrates. More particularly, according to the present invention, the target material is a cast silicon element, that has been solidified from the melt condition, with an additive mixed in with the melt. In another aspect, the present invention relates to a process for preparation of the aforesaid sputtering target and products obtained thereby Thin silicon layers in their nitride and oxide form are becoming increasingly important in modern glass coating processes. In particular, the technology is important in the fields of optical coatings on large glass surfaces, as well as architectural, automotive and anti-reflective glass. These layers are usually applied by means of sputtering technology. A $Si_3N_4$-like or $SiO_2$-like layer is deposited from a lightly doped silicon target via the extra addition of $N_2$, as the reactive gas. For flat sputtering cathodes, use is usually made of highly pure, polycrystalline, boron-doped or phosphorus-doped silicon as the target material.

A process is known for the application of optically transparent layers, which comprise compounds of silicon on planar substrates, by means of reactive cathode atomization of silicon-containing target materials (EP 0,165,413). In that process a cast polycrystalline silicon molded element, which solidified from the melted condition, and which comprises at least 99% silicon together with dopants selected from the boron, antimony, phosphorus and arsenic group that are mixed into the melt, is atomized in an atmosphere which contains a reactive gas selected from the group oxygen and nitrogen, by means of a direct current.

With prior technology, the boron or phosphorus doped polycrystalline silicon tiles have been found to be rather brittle and expensive. For example, such targets can only be used as bonded targets. Moreover, such targets are in short supply because they are predominantly produced for photovoltaic wafers, instead of sputtering targets.

It is also known that plasma-sprayed silicon targets can be used for rotating cathodes on tubular steel supports. U.S. Pat. No. 5,853,816 shows that aluminum can be added to silicon sputter targets but points out that with aluminum insufficient homogeneity cause arcing of the SiAl target. The reference proposes to produce silicon particles coated with a conductive material such as Al, Ni or an Al—Ni alloy and then vacuum plasma spraying these particles onto the sputtering target carrier.

The highly pure, silicon target material, that is used for flat cathodes, is generally obtained as a by-product from the preparation of silicon slices for photovoltaic technology. For this purpose, slowly crystallized tiles are reworked for equipping the cathode. These tiles are then joined together by soldering or adhesion techniques to give a large cathode. The tiles produced in this way are more expensive in production, and they are brittle and therefore easily cracked by sputtering or in handling. A considerable problem occurs because these prior known titles need to be bonded, i.e., soldered, to a metallic backing plate for fixation in the sputter machine. The reason that such tiles are expensive is because they are produced by a very time consuming melting process and by an expensive cutting and grinding process.

A sputtering target is also known, especially with large dimensions and comprising brittle materials such as e.g. Si, Ge, $In_2O_3$ and $SnO_2$ (DE-OS 19,527,476), which consists of a target base plate and a layer, which is arranged between the sputtering material and the base plate. The layer comprises an adhesive, preferably an epoxy resin adhesive, which has been mixed with a metal powder, whereby the target material is applied directly to the base plate with the intermediate inclusion of the adhesive layer, and the metal powder is formed from copper, nickel, gold or iron.

Finally, a target is known for the cathode of a device for coating work pieces (DE-OS 4,242,079), where the cathode is arranged in a processing chamber, which is capable of being evacuated and filled with a processing gas, together with a cathode element and with a number of target tiles. These are contiguously arranged in a row on the cathode element and which collectively form the target. There is at least one target base plate, which is arranged between the target tiles and the cathode element, whereby the target tiles, that are formed from the material that is to be sputtered off, each have a plate like or parallelepiped configuration with plane parallel faces and are firmly soldered, welded or glued in each case to a target base plate with similar dimensions. The base surfaces of the target base plates are designed to be slightly larger in their length than the base surface of the target tiles that are associated therewith in each case, whereby the two edge parts across the breadth of the target base plate, which project beyond the edge of the target tiles in each case, are held firmly on the cathode element with the help of grasping clips.

An object of the present invention is to create a target which is suitable for the preparation of silicon layers in their oxide or nitride form on a glass surface and which, in particular, is especially inexpensively capable of being molded into the configuration of tiles.

It is a further object of the present invention to avoid the need for bonding silicon sputtering targets to a base plate.

SUMMARY OF THE INVENTION

The above and other objects of the invention can be achieved by a target material which comprises silicon with the additive concentration of 1 wt % to 15 wt % aluminum. A molten melt of the silicon and aluminum is prepared. This material is then cast into a flat mold, which can take the shape of a tile on the solidified melt, preferably the configuration of a flat planar molded element with parallel faces.

The basic target material, to which the concentration of the aluminum has been mixed in with the silicon, is cast in a flat casting mold which is close to the final size of the desired target. The solidified semi-finished products, which have been cast closely to their final size, can be reworked into individual target tiles at comparatively low expense in terms of a minimum of grinding or cutting and are then assembled to provide the desired configuration.

Surprisingly, it has been found with sputtering targets comprising these cast silicon-aluminum tiles, which are close to the final size, that silicon oxide or silicon nitride layers can be sputtered with comparable optical parameters despite the casting defects, that are present, such as micropores and micro-fissures and despite the high aluminum doping level.

BRIEF DESCRIPTION OF THE DRAWING

The present invention will be further understood with reference to the accompanying drawing which is a schematic representation of carrying out the process of the invention.

DETAILED EMBODIMENT OF THE INVENTION

In carrying out the present invention there is added aluminum to silicon in the amount of 1 to 15%, preferably 7 to 10% by weight. The resulting mixture is cast into a flat planar casting mold and thereby a cost effective production process can be achieved. The addition of aluminum reduces the fragility of the target. By the present invention it is possible to eliminate the bonding of the target to a backing plate. In this way the targets produced according to the invention can be used as clamped, non-bonded target tiles.

In accordance with the process feature of the present invention, the equipment used for purposes of carrying out the invention is schematically illustrated in the accompanying drawing wherein a crucible (1) is used in conjunction with a flat, rectangularly shaped casting mold (2). The mold (2) has a major axis (j) and a minor axis (i) formed by 2 large flat surfaces spaced apart a distance (t) wherein j>i>t. This mold is open at the top as shown in the drawing. The resulting geometrically shaped object formed in the mold is referred to herein as a planar rectangular plate with parallel faces and conforms substantially to the final size, shape and dimensions of the silicon-aluminum target body. The melt is poured into the mold at the top through the opening of the dimension (t) as shown in the drawing.

The silicon material used for purposes of the present invention can be any suitable silicon typically used for preparation of sputtering targets. These are typically identified as 2N5 to 5N purity granules or broken scraps from the semiconductor industry. The aluminum compound is likewise preferred to be 2N5 to 5N purity.

The melt of the silicon and aluminum in the crucible takes place at about 1500° C. with a casting temperature of about 1450° C. The crucible itself can be graphite or aluminum. A crucible size of about 20 liters has been found to be convenient.

A vacuum induction furnace having a maximum power of 120 kW for 20 liters is sufficient. The atmosphere in the furnace is kept around $1 \times 10^{-1}$ mbar vacuum. Generally, if starting with a cold crucible, it takes about 2 hours to reach process time. The mold temperature is generally at room temperature before casting.

With a 20 liter crucible size, it is possible to fill about 10 molds, if the furnace is equipped with a lock-in chamber. The casting time is ½ to 2 minutes per mold, preferably 1 to 2 minutes.

As shown in the drawing, the mold has a rectangular shape with two larger flat surfaces of the dimension j×i separated a distance, t, by 2 narrow flat surfaces of the dimension i×j. This configuration of the mold with the relatively large flat surfaces separated a relatively small distance, t, from each other and with the top of the mold open enables the pouring of the molten melt into the mold and the solidification of the melt in a rapid cooling step into the superior target material of this invention.

Casting of silicon in a wide open conventional mold with slow cooling time produces a product having cracks all over.

While the presence of aluminum makes is possible to reduce the problem of cracking, it is really the mold configuration of a flat parallelepiped casting mold as shown in the drawing that overcomes the problems of the prior art.

It is an important feature of the present invention that the tiles produced as described herein can be used as clamped targets without being bonded to a backing plate. This enables the following advantages to flow to the users as a result of the invention:

a) quick and easy target exchanger at the time when a target is sputtered through;

b) the user does not need the infrastructure for bonding targets to a base plate thereby eliminating the need to send the target out to a commercial bond shop and the resultant savings afforded thereby, and c) the user does not need to keep several sets of based plates in stock.

EXAMPLE

Various alloys, which comprised industrially pure silicon and aluminum, i.e. 99.5% purity with respect to the metal in each case, were melted in a vacuum induction oven. Graphite was used as the crucible material. The receptacle used as the casting mold had the following dimensions: width 110 mm, thickness 16 mm and height 330 mm. The casting mold, of graphite was preheated to approximately 200° C. and was introduced into the vacuum oven through sluices directly before casting.

The following alloys were melted:

a) Si 99.5% purity without Al doping b) Si 99.5% purity+1 wt % Al c) Si 99.5% purity+5 wt % Al d) Si 99.5% purity+10 wt % Al e) Si 99.5% purity+15 wt % Al The purity of the aluminum is 2N5 to 5N purity.

Whereas with pure silicon (Example a), only completely broken up cast components were capable of being prepared, even after varying the deposition conditions, it was possible to produce intact plates starting from alloying levels of only 1 wt % Al. However, the cast plates with 1 wt % Al proved to be extremely sensitive to fissures during processing by means of grinding and sawing.

Target tiles with a size of 100×100×14 mm in each case were prepared from tiles with a 1 wt %, 5 wt %, 10 wt % and 15 wt % aluminum content by grinding the surfaces and separation by means of a diamond separating disk. The density was determined in each case in order to characterize the casting defects.

Sputtering experiments with 5 wt % Al, 10 wt % Al and 15 wt % Al resulted in completely comparable optical parameters compared with thin silicon layers in their oxide or nitride form which had been prepared from highly pure silicon. The significant results are summarized in the table below:

|  | Theoretical density | Measured density | Index of refraction at 550 nm $Si_3N_4$ | Index at 550 nm $SiO_2$ | Cracking risk |
|---|---|---|---|---|---|
| Pure Silicon | 2.33 | n.a. | 2.05 ± 0.05 | 1.46 ± 0.02 | Extreme |
| Si + | 2.33 | 2.18 | — | — | Very high |

-continued

|  | Theoretical density | Measured density | Index of refraction at 550 nm $Si_3N_4$ | Index at 550 nm $SiO_2$ | Cracking risk |
|---|---|---|---|---|---|
| 1 wt % Si + 5 wt % | 2.35 | 2.26 | 2.05 ± 0.05 | 1.47 ± 0.02 | High |
| Si + 10 wt % | 2.36 | 2.33 | 2.05 ± 0.05 | 1.48 ± 0.02 | Low |
| Si + 15 wt % | 2.38 | 2.37 | — | 1.50 ± 0.02 | Low |

Further variations and modifications of the foregoing will be apparent to those skilled in the art and are intended to be encompassed by the claims appended hereto.

German priority application 198 10 246.1 is relied on and incorporated herein by reference.

We claim:

1. A process for the preparation of a silicon-aluminum sputtering target body for depositing a silicon layer in nitride or oxide form by means of reactive cathode atomization in the form of optical functional layers or in the form of thermal protective layers on glass substrates, comprising forming a melt comprising silicon and aluminum under vacuum in a crucible, casting said melt into a planar rectangular mold conforming substantially to the final size, shape and dimension of the silicon-aluminum sputtering target body, to form a cast element solidifying by rapidly cooling said cast element in ½ to 2 minutes after casting down to the solidification of the melt to form a planar rectangular plate, wherein said aluminum is present in an amount sufficient to impart reduced cracking to said target.

2. The process according to claim 1 wherein the amount of aluminum is 1 to 15% by weight of said melt.

3. The process according to claim 1, further comprising casting said melt into a mold that is rectangular plate shaped.

4. The process according to claim 1 further comprising melting the aluminum and silicon in a crucible at a temperature of about 1500° C. in a vacuum induction furnace.

5. The process according to claim 1 further comprising casting said melt in a flat mold having an open top and a major axis (j), a minor axis (I) formed by flat surfaces separated a distance (6) wherein j>I>t and wherein the melt is poured into the top of the mold through an opening of the dimension t×i.

* * * * *